(12) United States Patent
Naidu et al.

(10) Patent No.: US 11,594,876 B2
(45) Date of Patent: Feb. 28, 2023

(54) ACCELERATED ZONE-2 PROTECTION FOR TRANSMISSION LINES

(71) Applicant: Hitachi Energy Switzerland AG, Baden (CH)

(72) Inventors: Obbalareddi Demudu Naidu, Bangalore (IN); Preetham Venkat Yalla, Bangalore (IN); Vedanta Pradhan, Bhubaneswar (IN); Nandkishor Kubal, Pune (IN); Sachin Srivastava, Bangalore (IN)

(73) Assignee: Hitachi Energy Switzerland AG, Baden (CH)

( * ) Notice: Subject to any disclaimer, the term of this patent is extended or adjusted under 35 U.S.C. 154(b) by 186 days.

(21) Appl. No.: 17/288,640

(22) PCT Filed: Oct. 22, 2019

(86) PCT No.: PCT/IB2019/058986
§ 371 (c)(1),
(2) Date: Apr. 26, 2021

(87) PCT Pub. No.: WO2020/089730
PCT Pub. Date: May 7, 2020

(65) Prior Publication Data
US 2021/0399545 A1     Dec. 23, 2021

(30) Foreign Application Priority Data
Oct. 31, 2018 (IN) .............................. 201841041170

(51) Int. Cl.
*H02H 7/26* (2006.01)
*G01R 31/08* (2020.01)

(52) U.S. Cl.
CPC ........... *H02H 7/265* (2013.01); *G01R 31/085* (2013.01)

(58) Field of Classification Search
CPC .............................. G01R 31/085; H02H 7/265
See application file for complete search history.

(56) References Cited

U.S. PATENT DOCUMENTS

| 4,766,549 A | 8/1988 | Schweitzer, III et al. |
| 9,588,168 B2 | 3/2017 | Schweitzer, III et al. |

(Continued)

FOREIGN PATENT DOCUMENTS

| JP | H063402 A | 1/1994 |
| JP | H0815363 A | 1/1996 |

(Continued)

OTHER PUBLICATIONS

Jiale, S., et al., "Transmission line pilot protection based on phase segregated model recognition", IET Generation, Transmission & Distribution, vol. 3, Issue 9, Jan. 10, 2009, pp. 885-890.

(Continued)

*Primary Examiner* — Michael J Dalbo
(74) *Attorney, Agent, or Firm* — Slater Matsil, LLP

(57) ABSTRACT

The invention relates to protection from faults in a power transmission system having two or more transmission lines. Travelling waves are detected from a signal obtained with a measurement equipment associated with a bus of the power transmission system. Arrival times of a first peak of a first travelling wave, a second travelling wave and a third travelling wave, are detected from the signal. A value for line length is calculated from the arrival times and propagation velocity of the travelling wave in the corresponding transmission line. The calculated value is compared with an actual length of the corresponding transmission line, for determining if the fault is an internal fault or an external fault. According to the fault being one of the internal fault (Continued)

and the external fault, a signal for controlling a switching device associated with the corresponding transmission line is generated.

19 Claims, 5 Drawing Sheets

(56) References Cited

U.S. PATENT DOCUMENTS

| | | | |
|---|---|---|---|
| 2006/0012374 A1* | 1/2006 | Kojovic | G01R 31/085 324/522 |
| 2016/0266192 A1* | 9/2016 | Burek | G01R 31/088 |
| 2019/0280476 A1* | 9/2019 | Fan | G01R 31/08 |
| 2020/0064391 A1* | 2/2020 | Dase | G01R 31/085 |

FOREIGN PATENT DOCUMENTS

| | | |
|---|---|---|
| JP | 2015154670 A | 8/2015 |
| WO | 2018007857 A1 | 1/2018 |
| WO | 2018122627 A1 | 7/2018 |

OTHER PUBLICATIONS

Leitloff, V., et al., "Novel Algorithm for Accelerated Second Zone Tripping of Non-Unit Distance Protection", Developments in Power System Protection, Conference Publication No. 479, 2001, pp. 434-437.

Moore, P J, et al., "Improved Zone 2 Accelerated Scheme Using Sound Phase Seen Impedance", Eighth IEE International Conference on Developments in Power System Protection, Apr. 5-8, 2004, pp. 457-460.

Novosel, D., et al., "IEEE PSRC Report on Performance of Relaying During Wide-Area Stressed Conditions", IEEE Transactions on Power Delivery, vol. 25, No. 1, Jan. 2010, pp. 3-16.

Rosas-Ortiz, G , et al., "High-speed backup scheme for zone 2 of non-pilot distance relays", IET Generation, Transmission & Distribution, vol. 1, Issue 6, Nov. 2007, pp. 938-947.

Suonan, Jiale, et al., "A Novel UHV/EHV Transmission-Line Pilot Protection Based on Fault Component Integrated Impedance", IEEE Transactions on Power Delivery, vol. 26, No. 1, Jan. 2011, pp. 127-134.

* cited by examiner

TABLE I: Different test cases covering all conditions

| Test Case | $t_{A1}$ (μs) | $t_{A2}$ (μs) | $t_{A3}$ (μs) | Actual line length in (km) | Calculated line length in (km) | Absolute difference of actual and calculated line length in (meters) | Threshold in (m) | Identified faulted line |
|---|---|---|---|---|---|---|---|---|
| A-g fault at 83% (125 km) of protected line (Internal fault) | 431 | 603 | 775 | 150 | 150.136 | 136 | 300 | Internal fault |
| A-g fault at 90% (135 km) of protected line (Internal fault) | 465 | 569 | 673 | 150 | 150.136 | 136 | 300 | Internal fault |
| A-g fault at 95% (143 km) of protected line (Internal fault) | 492 | 538 | 586 | 150 | 150.136 | 136 | 300 | Internal fault |
| A-g fault at 99% (148 km) of protected line (Internal fault) | 510 | 524 | 538 | 150 | 150.136 | 136 | 300 | Internal fault |
| A-g fault at 25% (25km) of line-4 (external fault) | 603 | 775 | 948 | 150 | 200.374 | 50374 | 300 | External fault |
| A-g fault at 13.33% (20km) of line-2 (external fault) | 586 | 724 | 862 | 150 | 190.211 | 40211 | 300 | External fault |
| A-g fault at 10% (12km) of line-3 (external fault) | 589 | 641 | 724 | 150 | 187.597 | 37597 | 300 | External fault |

FIG. 9

ACCELERATED ZONE-2 PROTECTION FOR TRANSMISSION LINES

CROSS-REFERENCE TO RELATED APPLICATIONS

This application is a national stage application of International Application No. PCT/IB2019/058986, filed on Oct. 22, 2019, which claims priority to Indian Patent Application No. 201841041170, filed on Oct. 31, 2018, which applications are hereby incorporated herein by reference.

FIELD OF THE INVENTION

The present invention generally relates to protection of power transmission systems, and more specifically to fault protection in case of zone-2 faults in power transmission systems.

BACKGROUND OF THE INVENTION

Distance relay is a widely adopted protection device that is designed to provide primary and backup protection in transmission lines. The distance relay can operate in zone-1 and zone-2, among others, to provide protection for the entire line distance. Zone-1 typically covers 80% of the line length, while zone-2 is set to be an intentional overreaching zone to cover the remaining 20% (of line length) of the protected line. In case of zone-1 faults, the relay operates instantaneously, while in case of zone-2 faults, the relay operates after a delay.

In zone-2 operation, the time delay is about 15-20 cycles (300-400 ms (milliseconds)). The main reason behind the delay in operation is the time required for coordination with other distance relays, which protect downstream transmission lines. As mentioned, a distance relay at one end of a transmission line protects 80% of the line with instantaneous operation. Considering fault resistance and other errors or system behavior, typically this percentage may reduce below 80% of the line length. For example, faults such as short circuit faults in a second half (or half section) of the line are cleared after the intentional delay, as they get recognized as zone-2. This latency has impact on power system stability, but at the same time it prevents fast auto-reclosing.

There are certain communication based protection methods that attempt to reduce the delay in case of zone-2 operation. These methods employ communication links for data exchange and decision-making. A communication link is also used in these methods to exchange the breaker status information from the remote bus. Accuracy of these methods depends on the reliability of the communication infrastructure. Moreover, these methods are not economical and may not always work, for example when there is a communication failure. Examples of some such protection schemes using communication are listed below:

Permissive Overreaching Transfer Trip (POTT)
Permissive Under reaching Transfer Trip (PUTT)
Directional Comparison Blocking (DCB)
Directional Comparison Unblocking (DCUB)
Direct Under reaching Transfer Trip (DUTT)
Direct Transfer Trip (DTT)

There are certain other methods that try to determine the status/operation information for the breaker at the remote end of the line. For example, one method is based on the principle of detecting the three-pole operation of the remote breaker, and makes use of this detection to accelerate the operation of the relay in case of zone-2 faults. This method is not suitable for a single-pole trip operation. Taking another example, another method is based on monitoring the imaginary part of impedance seen by distance relay, to detect three-pole tripping of the remote breaker following any unsymmetrical zone-2 fault. This method also is not suitable for single-pole trip, or for symmetrical faults. Taking yet another example, another method is based on the monitoring of the impedance trajectory characteristic associated with the remote breaker operation. This method is not sensitive for low resistance faults.

Thus, the known methods require communication between distance relays, or analyzing the operation status of the breaker at the remote end of the line. These methods have limitations such as requiring dedicated communication infrastructure, susceptible to communication failures, ability to detect only certain types of faults from specific breaker status/operation monitoring using phasor information, which may be difficult to calculate accurately during faults.

With rapid integration of renewable energy sources combined with recent advancements in power transmission technologies, a large amount of power is transferred across long distances. This brings challenges in secure and reliable operation of the power system. Integration of renewable energy (low inertia) systems to the grid is likely to impact the grid stability margin, and therefore necessitates faster fault clearing protection schemes. Moreover, faster fault clearing is very important to prevent equipment damage and improve transient stability of the power systems.

There is accordingly the need for a faster selective zone-2 protection scheme for transmission lines without requiring any communication between local and remote protection devices, and which can work for different types of fault scenarios.

SUMMARY OF THE INVENTION

An aspect of the invention relates to a method for protection in a power transmission system. The power transmission system has two or more power transmission lines (transmission lines or lines). For example, the power transmission system can have two transmission lines, where a first power transmission line is connected with a first bus (or terminal) at one end and a second bus (or terminal) at another end, and a second transmission line is connected with the second bus at one end and a third bus (or terminal) at another end. There could be more than two lines, or three buses. For instance, two transmission lines can be connected between the first and second buses, while a third transmission line is connected between the second and third buses, and a fourth transmission line is connected between the second bus and a fourth bus.

There could be a fault (or disturbance) in the power transmission system. For instance, there could be a fault in a transmission line of the two or more transmission lines. Faults in transmission lines can occur because of storms, lightning, snow, freezing, rain, insulation breakdown, short circuits etc., which may be caused by bad weather conditions, birds or other external objects/disturbances.

Travelling waves are generated when there is a fault in a line. These travelling waves can be detected and travelling wave characteristics such as peaks, arrival times etc. determined from measurements carried out at an end of the line. In other words, travelling waves and parameters thereof can be detected, or calculated from single ended measurements (single ended method).

The method includes detecting a plurality of travelling waves from a signal obtained with a measurement equipment associated with one of the buses (e.g. one of the first bus and the third bus) of the power transmission system. The measurement equipment can include a current transformer, a potential transformer, a sensor-based measurement equipment (e.g. Rogowski coils, non-conventional instrument transformers etc.) and/or the like, which provides a signal corresponding to current, voltage or other information as sensed from the line.

In accordance with the method, the measurements from one end are used for detecting the location of the fault. For example, the measurement equipment can be a current transformer associated with the first bus, and the travelling waves are detected from the measurements carried out at the first bus. Here, a current signal from the current transformer may be digitized and processed to detect the travelling waves.

The method also includes determining arrival times of a first peak of a first travelling wave, a second travelling wave and a third travelling wave detected from the signal. Thus, for example arrival times of the first peak of the first three travelling waves are detected (determined/calculated) from the signal at the first bus. Here, the first travelling wave is the wave that travels directly from the fault point to the bus (where the signal is measured), while the others are reflected waves (i.e. waves reflected from other (remote) bus).

A value for line length (of the line having the fault) is calculated based on the arrival times of the first peak of the first, second and third travelling waves, and a propagation velocity of the travelling wave in a power transmission line connected with the corresponding bus of the power transmission system. For example, the value for line length is calculated with:

$$f\ell_{cal} = (2t_{A3} - 3(t_{A2} - t_{A1}))\frac{V}{2}.$$

In the above, $f\ell_{cal}$ is the value calculated for the line length, $t_{A1}$, $t_{A2}$, and $t_{A3}$ are the arrival times of the first, second and third travelling waves, and v is the propagation velocity of the travelling wave. In case the propagation velocity of travelling wave is different in different lines, the propagation velocity in the transmission line the bus (terminal) is connected needs to be considered (e.g. first line in case of first bus, second line in case of third bus etc. in case of above example).

The method further includes determining whether the fault is one of an internal fault and an external fault based on a comparison of the value calculated for the line length and an actual line length of the power transmission line connected with the corresponding bus. Here, the internal fault is a fault in the power transmission line that is connected with the corresponding bus, and the external fault is a fault in a power transmission line that is connected with another bus of the power transmission system.

Thus, for example, when the method is performed with the signal at the first bus, the value calculated for the line length is compared with the actual line length of the first transmission line connected at one end with the first bus. Here, the internal fault is when the fault is in the first transmission line, and the external fault is when the fault is in the second transmission line.

In case of the internal fault, the fault can be located in one of a zone-1 and zone-2 of operation of a protection device associated with the corresponding bus. In case of a zone-2 fault, the fault location can be in a second half or section (connecting mid-point of line with the remote bus) of the corresponding transmission line (e.g. first transmission line in case of the first bus), or in another transmission line (e.g. second transmission line). Accordingly, the step of determining whether the fault is one of the internal fault and the external fault can include comparing the difference between the value calculated for the line length, and the actual length of the power transmission line connected with the corresponding bus, with a threshold value.

The threshold value can be determined such that it is associated with the internal fault in the second half of the power transmission line connected with the corresponding bus (e.g. second half of the first line). The determination of the threshold value can be performed beforehand from history data for the line and/or with information from operating personnel or experts.

According to the determination of the fault being one of the internal fault and the external fault, a signal is generated for controlling a switching device associated with the power transmission line connected with the corresponding bus. For example, a trip signal is generated for a circuit breaker associated with the first bus, based on the determination of the fault being one of the internal fault and the external fault. This signal is generated to protect the power transmission system, for example to isolate the transmission line/system.

Depending on the type of fault (i.e. internal or external), a time of operation of the switching device can be determined. For example, the circuit breaker can operate instantaneously when the fault is determined to be the internal fault, while the circuit breaker can be operated after an intentional delay when the fault is determined to be the external fault. Thus, when it is determined that the fault is on the line that the bus is connected with, the switching device can be operated instantaneously, while in case of fault on other line, the switching device can be operated after a certain delay.

The method can be implemented with a protection device, for example with an intelligent electronic device (IED), a protection relay or controller. The protection device can perform the method with measurements carried at an end of the line the device protects, i.e. the protection device performs the method with single end measurements.

Accordingly, an aspect of the invention is related to a device for protection in the power transmission system. This device can be for example the IED, distance relay, or controller, associated with one of the buses of the power transmission system, for protecting the corresponding line. For example, the device can be an IED associated with the first bus for protecting the first transmission line.

This device has measurements carried out at the corresponding bus/terminal, for example received at an input interface of the device. The IED can receive a signal(s) from the measurement equipment, and obtain measurements therefrom.

The steps of the method may be performed by one or more modules. The modules may be implemented with one or more processors. For instance, in the example where the IED performs the method, the modules are implemented with the processor of the IED. In an embodiment, the modules include a travelling wave module, a length calculation module, and a trip module.

The traveling wave module detects the plurality of travelling waves from the signal obtained with the measurement equipment associated with the corresponding bus. The travelling wave module also determines the arrival times of the first peak of the first, second and third travelling waves from the signal.

The length calculation module calculates the value for line length based on the arrival times of the first peak of the first, second and third travelling waves, and a propagation velocity of the travelling wave in the power transmission line connected with the corresponding bus. The length calculation module also determines whether the fault is one of the internal fault and the external fault based on the comparison of the value calculated for the line length and the actual line length of the power transmission line connected with the corresponding bus.

The trip module generates the signal for controlling the switching device associated with the power transmission line connected with the corresponding bus. The trip mode generates the signal based on the determination of the fault being one of the internal fault and the external fault.

BRIEF DESCRIPTION OF DRAWINGS

The subject matter of the invention will be explained in more detail in the following text with reference to exemplary embodiments which are illustrated in attached drawings in which:

FIG. 9 is a table of results obtained for different test cases.

DETAILED DESCRIPTION

Various aspects of the present invention relate to fault protection in a power transmission system. The power transmission system connects two or more power sources/loads with two or more transmission lines. For example, the power transmission system can connect an AC system with a load, two substations etc.

Figure 1:
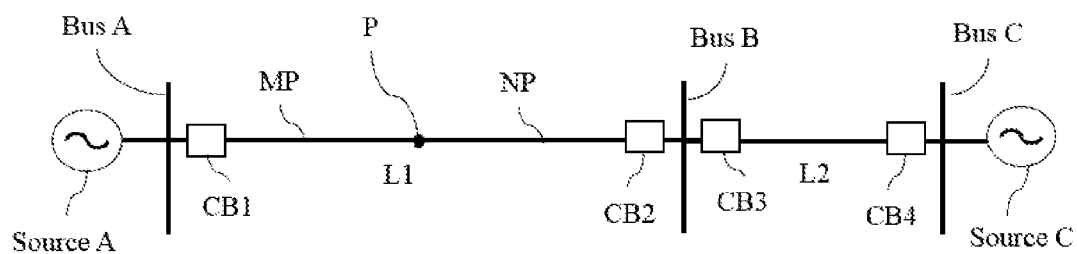
FIG. 1 is a simplified representation of a power transmission system, in accordance with an embodiment of the invention.

Referring to FIG. 1, which illustrates a power transmission system (100), in accordance with an embodiment of the invention. As shown, the system connects two power sources, i.e. sources A and C, which can be substations. The two sources are connected with two power transmission lines (transmission lines or lines)—a first transmission line (shown by L1) and a second transmission line (shown by L2). As shown, L1 is connected with two buses (or terminals)—bus A and bus B, at its ends, and L2 is connected with two buses (or terminals)—bus B and bus C. There could be multiple lines, in which case there could more number of lines, buses etc. between the entities connected by the power transmission system. Further, more than one line can be connected between two buses, or originate from a bus. For example, there could be two lines connected between buses A and B, while a third line connecting buses B and C, and a fourth line connecting buses B and D (D is not shown in FIG. 1).

The present invention provides a method for protection for such power transmission systems. The method is performed in response to a fault in the power transmission system, for example in a line (e.g. L1 or L2) of the power transmission system. The objective of the method is identify faults located in the faulted line with single ended measurements, and enable the protection function, even when the fault is in zone-2. In case of FIG. 1, a fault in a second half or section (shown by NP, which connects midpoint P with bus B) of the line, may be a zone-1 or zone-2 (from bus A). In such a case, the method identifies if the fault located in the second half of the line (i.e. NP of L1), or in another line (L2).

The identification of the faulted section (or faulted line) is used for controlling a switching device connected with the faulted line. Controlling the switching device includes operating the switching device to protection (e.g. disconnect) the line. The switching device may be a circuit breaker, which can be controlled with an IED or controller. For example, the switching device may be a circuit breaker such as CB1 or CB2 connected with the line as shown in FIG. 1.

Figure 2:
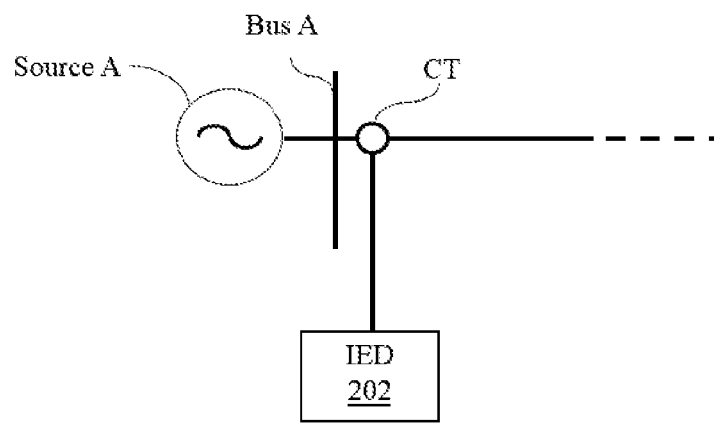
FIG. 2 is a simplified representation of a connection of a protection device with a measurement equipment associated with a power transmission line of the power transmission system, in accordance with an embodiment of the invention.

The method is performed with a protection device associated with controlling the switching device. For example, the method can be implemented by an IED (or a distance relay or a controller). This may be an IED associated with a bus (e.g. bus A). An example is illustrated in FIG. 2, wherein the IED (202) is associated with Bus A. The IED receives one or more signals from one or more measurement equipment connected to the power transmission line.

In the example of FIG. 2, a current transformer (CT) provides single/multiple phase current signal to the IED. It should be apparent that the IED can receive signals from current transformers, voltage transformers, or other measurement equipment. Also, the IED can have both current and voltage measurements for the terminal. The IED can receives the signal(s) from the measurement equipment, and obtain measurements therefrom.

Figure 3:
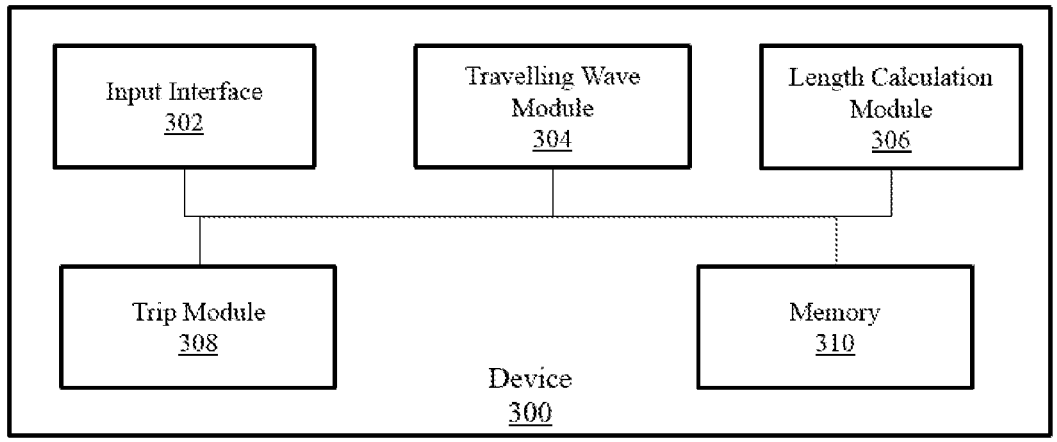
FIG. 3 is a block diagram of a device for protection of the power transmission system, in accordance with an embodiment of the invention.

In an embodiment, the method is implemented with a device associated with the power transmission system, wherein the device has a plurality of modules. This can be for example an IED at an end of a line, responsible for protection of the line (e.g. IED 202 at bus A, for protecting line 1). FIG. 3 is a simplified block diagram of the device. In accordance with the embodiment illustrated in FIG. 3, the plurality of modules include an input interface (302), a travelling wave module (304), a length calculation module (306), a trip module (308) and a memory (310).

Each module of the device carries out one or more steps of the method (described herein after in conjunction with description of FIG. 4). It should be noted that there could be fewer or more modules. For example, some steps can be clubbed or integrated into a single module Taking another example, some steps can be done in other devices, and made available for the protection device. Further, the plurality of modules may be implemented using one or more processors. For instance, the one or more processors may be a processor of an IED (e.g. IED 202). Thus, various steps of the method can be embodied in the form of executable instructions, and stored in a memory. The instructions can be accessible to, and executed by the processor of the protection device for performing the method.

Figure 4:
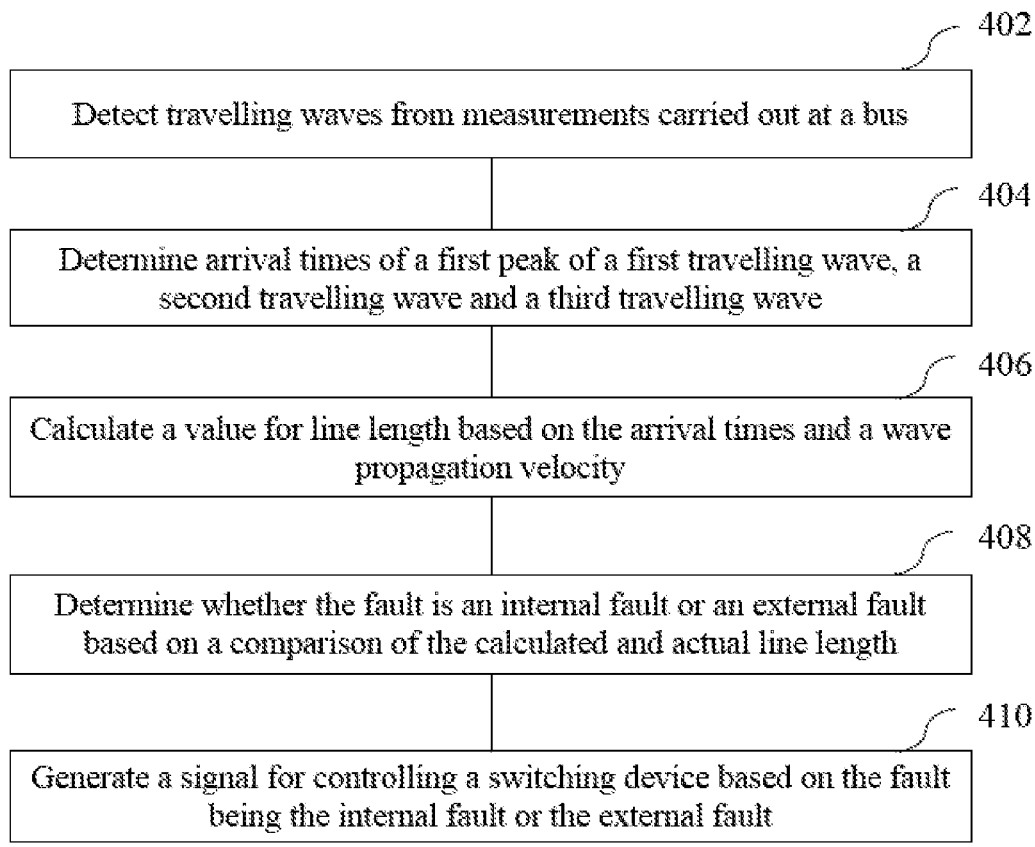
FIG. 4 is a flowchart of a method for protection of the power transmission system, in accordance with an embodiment of the invention.
Figure 5:
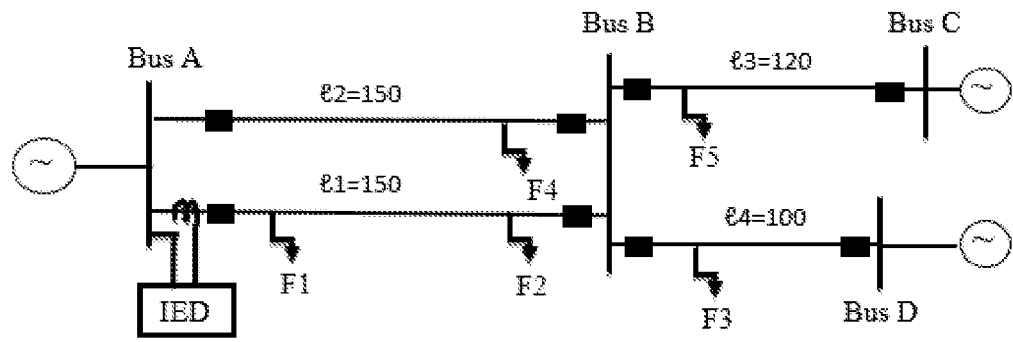
FIG. 5 is a simplified representation of the power transmission system, in accordance with another embodiment of the invention.

Referring to FIG. 4, which illustrates a flowchart of the method for protection, in accordance with an embodiment. The method will be explained using the power transmission system shown in FIG. 5 as an example. The power transmission system connects three power systems. As shown in FIG. 5, the power transmission system has four power transmission lines—l1, l2, l3 and l4. Here, l1 and l2 are connected between bus A and bus B, l3 is connected between bus B and bus C and l4 is connected between bus B and bus D.

A protection device (IED such as 202, 300) is placed at bus A. While only one protection device is shown in FIG. 5, it should be apparent that more than one protection device can be associated with each line. For example, two distance relays may be provided for l1, one at bus A and one at bus B, and similarly for other lines for protection thereof. Taking another example, two relays can be provided at each end of a line.

There could be faults (or disturbances) in the power transmission system, for example on a line. Example fault cases (faults) are shown by F1, F2, F3, F4 and F5, where F1 and F2 are faults on l1, F3 is on l4, F4 is on l2 and F5 is on l3. In the prior art, for F1, IED at bus A would detect the same as zone-1 fault, and operate without any delay, whereas for faults F2 to F5, the IED would detect them as zone-2 faults and operate after 300-400 ms (15-20 cycles) of intentional delay. It is desirable that the IED placed at bus A should clear the internal fault cases F1 and F2 without any delay.

The above response for fault cases F1 and F2 requires quick identification of the faulted line segment (half or section (e.g. MP, NP are half sections of l1 shown in FIG. 1)). This can identify whether the fault is in the second half section of the protected line, or on another line using single ended information (i.e. at local end where the IED is operating). The quick identification of the faulted line segment enables selective or accelerated zone-2 operation, which is provided by the present invention.

Travelling waves are generated when there is a fault in a line. These travelling waves can be detected and characteristics of the waves such as peaks, arrival times etc. determined from measurements carried out at an end of the line. In other words, travelling waves and parameters thereof can be detected, or calculated from single ended measurements (single ended method).

At 402, the method includes detecting a plurality of travelling waves from a signal obtained with a measurement equipment associated with one of the buses of the power transmission system. The travelling waves can be detected with the travelling wave module, which is configured to process the signal to detect the travelling waves and characteristics thereof (e.g. peak detection, arrival times etc.).

In the system of FIG. 5, the IED at bus A can detect travelling waves from a current signal at bus A, where the current signal is obtained with a current transformer. For example, a current signal may be digitized and processed to detect a travelling wave. The processing can include applying a transformation (e.g. Clark transformation) to the current signal, and extracting aerial mode (alpha component or beta component) and ground mode components of the (current) signal. The alpha component or beta component can then be input to a second order band pass/low pass filter (e.g. Butterworth filter). The band pass/low pass filter is used to filter out unwanted noise, and extract the travelling waves within a predetermined frequency band. This process can be applied for a single phase, or repeated for each phase in a multi-phase line.

At 404, arrival times of a first peak of a first travelling wave, a second travelling wave and a third travelling wave are determined from the signal. Thus, for each extracted travelling wave (e.g. the first three travelling waves), the first peak arrival times can be determined by the travelling wave module. The arrival times of the first peak can be determined using peak detection/determination techniques. In an implementation, leading-edge tracking (used in radar systems) is used for determining the arrival times. It overcomes the effects of signal distortion and allows for more accurate interpolation between samples.

Figure 6:
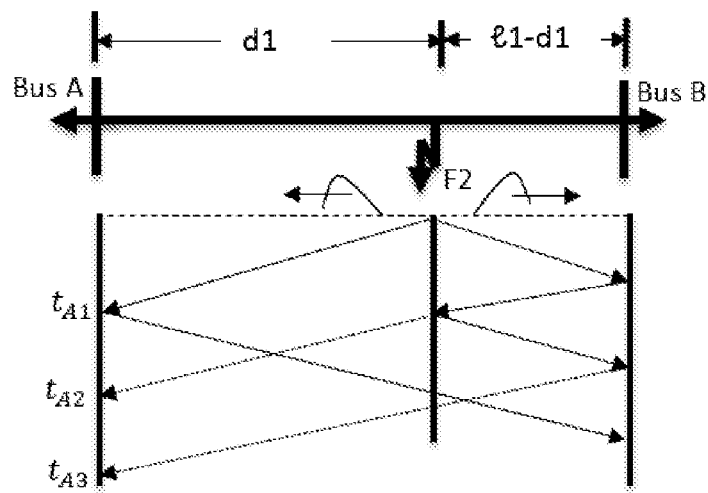
FIG. 6 is a lattice diagram of a fault in a line of the power transmission system, in accordance with an embodiment of the invention.

Let us consider the fault case F2, in the second half section of the protected line l1 for the IED at bus A. The lattice diagram for the fault is shown in FIG. 6. From the lattice diagram, it can be observed that the first traveling wave front arrives from fault point, and the second and third traveling waves arrives from bus B. Here, the second and third waves are reflected from the remote bus, and/or from the fault point. The arrival times of the first peak can be determined from the signal, i.e. by extracting the travelling wave and characteristics thereof. From the lattice diagram, we can deduce:

$$t_{A1} = t_{A0} + \frac{d_1}{V} \quad (1)$$

$$t_{A2} = t_{A0} + \frac{2\ell_1 - d_1}{V} \quad (2)$$

$$t_{A3} = t_{A0} + \frac{4\ell_1 - 3d_1}{V} \quad (3)$$

where $d_1$=fault location distance from IED at bus A in case of the fault in the second half section of protected line (ii); $t_{A0}$=fault inception time; $t_{A1}$, $t_{A2}$ and $t_{A3}$=first, second and third traveling wave front arrival time recorded (determined and stored) by IED at bus A; $\ell_1$=length of the protected line; and V=propagation velocity of the protected line (l1).

At 406, a value for line length is calculated based on the arrival times of the first peak of the first, second and third travelling waves, and a propagation velocity of the travelling wave in the power transmission line connected with the corresponding bus (ii in the example). The line length value can be calculated with the length calculation module, which is configured to calculate the line length value and also identify the faulted line segment (half or section) with the extracted travelling wave characteristics (e.g. arrival times) and other information related with the line (e.g. line length, propagation velocity of the travelling wave in the line). The information such as line lengths, and wave propagation velocity, can be available with the protection device (IED), for example stored in the memory thereof.

From equations (1)-(3), a length of protected line can be calculated as in (4)

$$f\ell_{1\_cal} = (2t_{A3} - 3(t_{A2} - t_{A1}))\frac{V}{2} \quad (4)$$

where $f\ell_{1\_cal}$ represents the length of protected line calculated using the arrival times and the propagation velocity.

Equations (1)-(3) and hence (4) are valid only if the fault is on the second half section of the line (l1), i.e., $$\frac{3\ell_1}{4} \le d_1 \le \ell_1.$$

Therefore, at 408, the method includes determining whether the fault is one of an internal fault and an external fault based on a comparison of the actual and calculated values of the line length of the power transmission line connected with the corresponding bus. The internal fault, in accordance with the method, is a fault (F1, F2) in the protected transmission line for which the signal is obtained (i.e. l1 for which signal at bus A is obtained). The fault case F1 can be detected by the protection device, as done for zone-1 faults.

The faulted line segment (i.e. if the second half or section has the fault) can be identified by comparing the difference between the calculated and the actual length of the protected line with threshold value (E). This comparison is performed to cover the length of the line, which is zone-2 operating area, and typically over the zone-1 operating area, i.e. for more than 75% of the line length (from the bus where the signal is measured). Thus, the fault case F2 can be identified by checking, $$\text{abs}(\ell_1 - \ell_{1_{cal}}) < \varepsilon.$$

In case the difference is less than the threshold value, the fault is determined to be an internal fault (i.e. F2 for the example), otherwise it is determined to be an external fault (i.e. on another line).

In accordance with an implementation, the threshold value for a sampling rate of 1 MHz is 300 meters. The threshold can be determined for the line from history data of the line, for example by an operating personnel or expert. This can be available with the length calculation module for comparison (e.g. stored in the memory).

According to the determination of the type of fault, which is the fault being one of the internal fault and the external fault, at 410, a signal is generated for controlling a switching device associated with the protected transmission line. Thus, the trip module (of the IED at bus A) can generate a trip signal for the circuit breaker associated with l1 at bus A, when it is an internal fault. If it is an external fault, the trip module generates the trip signal after the delay, i.e. as per usual zone-2 operation.

The method has been described above using the power system shown in FIG. 5, and with the IED at bus A performing the method as an example. It should be noted that the method can be implemented with different types of power transmission systems, some examples of which have been provided above in description of FIG. 1. Also, the method can be implemented with the protection device at any terminal, for protecting the line it is associated with, with the signals measured at the corresponding terminal, to have accelerated zone-2 operation.

Two fault (internal and external) cases are used to illustrate the working of the method.

Figure 7:
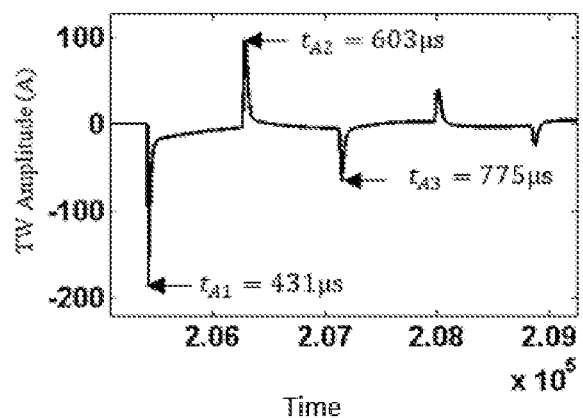
FIG. 7 is a chart showing first peak arrival times of travelling waves, in accordance with an example implementation.

Internal Fault Case (F2):

FIG. 7 shows three peak arrival times (as recorded at the bus A) of the current traveling wave for a fault at 125 km (83.33% of line) from bus A. They are 431, 603 and 775 µs (microsecond) respectively. Propagation velocity of the protected line is 2.90398525e+08 m/s. Line length calculated using equation (4) is 150.136 km. The difference between the actual protected line length (150 km) and calculated line length is 136 meters, which is less than the threshold of 300 meters. Therefore, the fault is identified as an internal fault (second half section of the protected line).

External Fault Case (F3):

Let us consider a fault at 25% (=25 km) of the line 4 (l4) as shown in FIG. 5. The arrival times of the first peak of the first three traveling wave recorded by IED at bus A are 603, 775 and 948 µs. Propagation velocity of protected line and line 4 is 2.90398525e+08 m/s. Line length calculated using equation (4) is 200.376 km. The difference between the actual protected line length and calculated line length 50.37 km, which is not less than the threshold of 300 meters. Therefore, the fault is identified as external fault, as a typical zone-2 fault as shown by FIG. 8.

Figure 8:
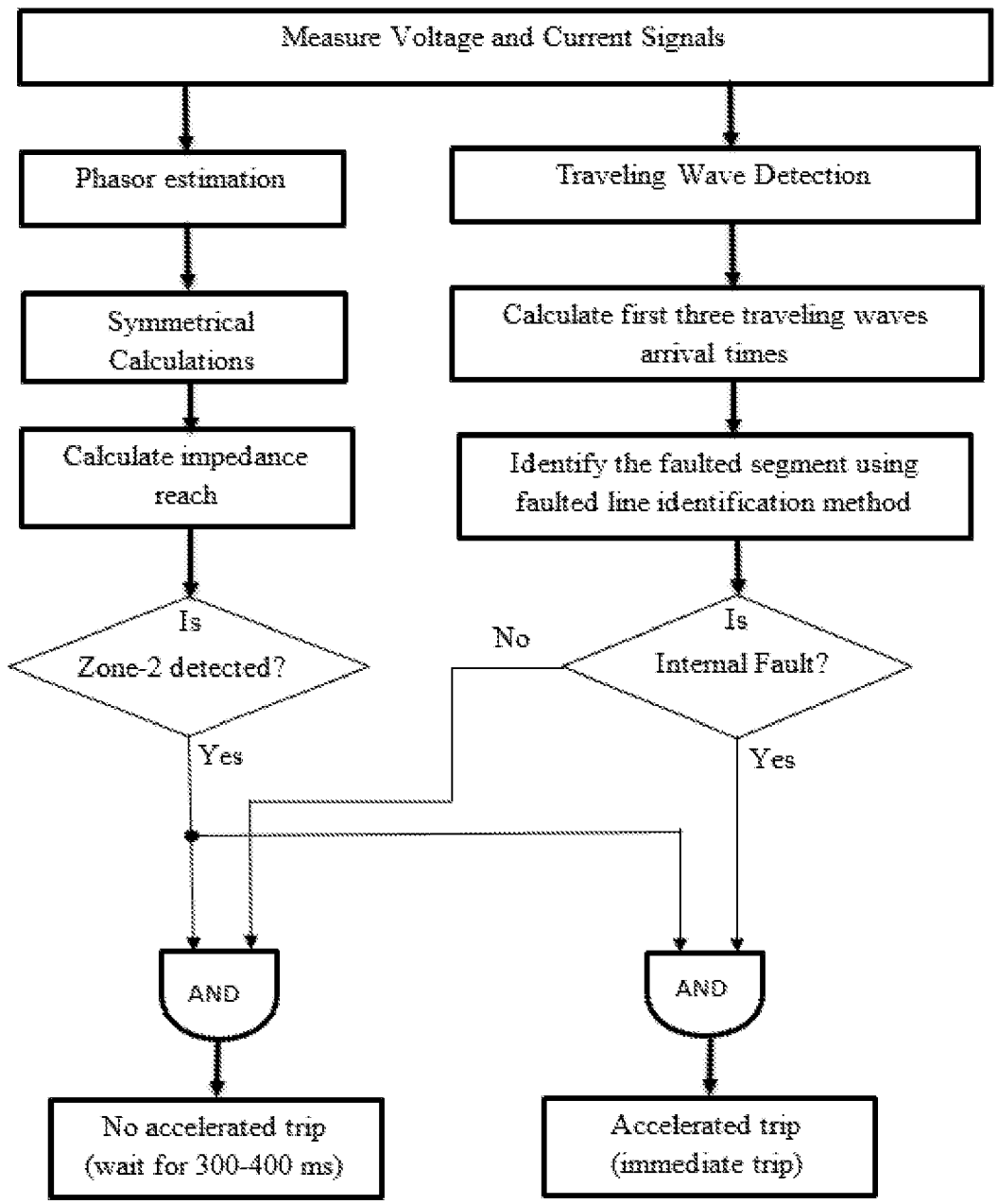
FIG. 8 is a flowchart of a method for protection of the power transmission system, in accordance with another embodiment of the invention.

In FIG. 8, the travelling wave based internal fault calculation is according to the method described herein, while the phasor calculation based method for zone-2 detection is the prior art approach. The results of the phasor based approach and the method disclosed herein are combined for selective acceleration of zone-2 operation, in accordance with the embodiment.

A 400 kV, 50 Hz four bus transmission system has been considered for testing the method. Length of the protected line is 150 km Current transformer (CT) model is considered for acquiring current signals from the system. The current signals are acquired at a sampling rate of 1 MHz in the test. Traveling waves are extracted using band pass filter in the test. The method has been tested for different test cases covering important scenarios. The results obtained are tabulated in Table I (shown in FIG. 9). Although the test is carried out for a sampling rate of 1 MHz, the method can be implemented with other (e.g. lower) sampling frequencies. As seen in Table I, by using the method, the faulted line segment is accurately identified for all the test cases.

The travelling wave based method of the present invention identifies whether a fault is in the second half section of the protected line, or on the remote line, using single ended information. The method does not depend on communication from the device at the remote end. Moreover, the faulted line can be identified in milliseconds as it uses travelling wave approach, which is superior from phasor based approaches. The fault location information is used to accelerate the zone-2 operation (i.e. for internal faults). This hybrid approach can clear the zone-2 internal faults within a cycle's time without any communication. The protection method is reliable and economical for practical deployment.

We claim:

1. A method for protection in a power transmission system comprising two or more power transmission lines including a first power transmission line that is coupled with a first bus at one end and a second bus at another end, and a second transmission line that is coupled with the second bus at one end and a third bus at another end, the method comprising:

detecting a plurality of travelling waves from a signal obtained with measurement equipment associated with a corresponding bus that is the first bus or the third bus of the power transmission system, the travelling waves having been generated due to a fault in the power transmission system;

determining arrival times of a first peak of a first travelling wave, a second travelling wave and a third travelling wave detected from the signal;

calculating a value for line length based on the arrival times of the first peak of the first, second and third travelling waves, and a wave propagation velocity in a power transmission line coupled with the corresponding bus of the power transmission system;

determining whether the fault is an internal fault or an external fault based on a comparison of the value calculated for the line length and an actual length of the power transmission line coupled with the corresponding bus, wherein the internal fault is a fault in the power transmission line that is coupled with the corresponding bus and wherein the external fault is a fault in a power transmission line that is coupled with another bus of the power transmission system; and generating a signal for controlling a switching device associated with the power transmission line coupled with the corresponding bus based on the determination of the fault being one of the internal fault and the external fault, wherein the switching device is controlled to protect the power transmission system.

2. The method of claim 1, wherein generating the signal comprises determining a time of operation of the switching device, wherein the switching device is operated instantaneously when the fault is determined to be the internal fault, and wherein the switching device is operated after an intentional delay when the fault is determined to be the external fault.

3. The method of claim 2, wherein the internal fault is located in zone-2 of operation of a protection device associated with a power transmission line coupled with the corresponding bus.

4. The method of claim 1, wherein determining whether the fault is the internal fault or the external fault comprises comparing the difference between the value calculated for the line length and the actual length of a power transmission line coupled with the corresponding bus with a threshold value.

5. The method of claim 4, wherein the threshold value is associated with the internal fault in a second half of the power transmission line coupled with the corresponding bus.

6. A protection device for a power transmission system that comprises a plurality of power transmission lines including a first power transmission line that is coupled with a first bus at one end and a second bus at another end and a second transmission line that is coupled with the second bus at one end and a third bus at another end, the device comprising:

a processing unit comprising one or more processors; and
a memory coupled to the processing unit, the memory storing instructions that, when executed by the processor, cause the processor to perform a method comprising:
receiving a signal obtained with measurement equipment associated with a corresponding bus that is the first bus or with the third bus of the power transmission system;
detecting a plurality of travelling waves from the signal obtained with a measurement equipment, wherein the travelling waves having been generated due to a fault in the power transmission system;
determining arrival times of a first peak of a first travelling wave, a second travelling wave and a third travelling wave detected from the signal;
calculating a value for line length based on the arrival times of the first peak of the first, second and third travelling waves and a propagation velocity in a power transmission line coupled with the corresponding bus of the power transmission system;
determining whether the fault is an internal fault or an external fault based on a comparison of the value calculated for the line length and an actual length of the power transmission line coupled with the corresponding bus, wherein the internal fault is a fault in the power transmission line that is coupled with the corresponding bus, and wherein the external fault is a fault in a power transmission line that is coupled with another bus of the power transmission system; and
generating a signal for controlling a switching device associated with the power transmission line coupled with the corresponding bus based on the determination of the fault being one of the internal fault and the external fault, wherein the switching device is controlled to protect the power transmission system.

7. The device of claim 6, wherein the device comprises an input interface for receiving the signal from the measurement equipment.

8. The device of claim 7, wherein the measurement equipment obtains measurements of currents at the corresponding bus of the power transmission system.

9. The device of claim 6, wherein the device is a distance relay associated with the first bus or the third bus.

10. The device of claim 6, wherein generating the signal comprises determining a time of operation of the switching device, wherein the switching device is operated instantaneously when the fault is determined to be the internal fault, and wherein the switching device is operated after an intentional delay when the fault is determined to be the external fault.

11. The device of claim 10, wherein the internal fault is located in zone-2 of operation of a protection device associated with the corresponding power transmission line.

12. The device of claim 6, wherein determining whether the fault is the internal fault or the external fault comprises comparing the difference between the value calculated for the line length and the actual length of a power transmission line coupled with the corresponding bus with a threshold value.

13. The device of claim 12, wherein the threshold value is associated with the internal fault in a second half of the power transmission line coupled with the corresponding bus.

14. A power transmission system comprising:
the protection device of claim 6;
the first bus;
the second bus;
the third bus;
the first power transmission line coupled with the first bus at the one end and with the second bus at the other end;
the second transmission line coupled with the second bus at the one end and with the third bus at the other end;
the measurement equipment coupled to the protection device and to the corresponding bus; and
the switching device coupled to the corresponding bus.

15. A method for protection in a power transmission system comprising two or more power transmission lines including a first power transmission line that is coupled with a first bus at one end and a second bus at another end and a second transmission line that is coupled with the second bus at one end and a third bus at another end, the method comprising:
measuring electrical characteristics of the first bus;
generating a signal indicating the electrical characteristics;
detecting a plurality of travelling waves from the signal indicating the electrical characteristics, the travelling wave having been generated due to a fault in the power transmission system;
determining arrival times of a first peak of a first travelling wave, a second travelling wave and a third travelling wave detected from the signal;
calculating a value for line length based on the arrival times of the first peak of the first, second and third travelling waves, and a wave propagation velocity in a power transmission line coupled with the first bus;

determining whether the fault is an internal fault or an external fault based on a comparison of the value calculated for the line length and an actual length of the power transmission line coupled with the first bus, wherein the internal fault is a fault in the power transmission line that is coupled with the first bus and wherein the external fault is a fault in a power transmission line that is coupled with a bus of the power transmission system other than the first bus; and generating a signal for controlling a switching device associated with the power transmission line coupled with the first bus based on the determination of the fault being one of the internal fault and the external fault, wherein the switching device is controlled to protect the power transmission system.

16. The method of claim 15, wherein generating the signal comprises determining a time of operation of the switching device, wherein the switching device is operated instantaneously when the fault is determined to be the internal fault, and wherein the switching device is operated after an intentional delay when the fault is determined to be the external fault.

17. The method of claim 16, wherein the internal fault is located in zone-2 of operation of a protection device associated with the corresponding power transmission line.

18. The method of claim 15, wherein determining whether the fault is the internal fault or the external fault comprises comparing the difference between the value calculated for the line length and the actual length of the power transmission line coupled with the corresponding bus with a threshold value.

19. The method of claim 18, wherein the threshold value is associated with the internal fault in a second half of the power transmission line coupled with the corresponding bus.

* * * * *